Nov. 12, 1957 J. B. GRAY III 2,813,191

RESISTANCE SOLDERING FIXTURE

Filed Nov. 7, 1955

INVENTOR
J B GRAY, III
BY W. C. Parnell
ATTORNEY

United States Patent Office 2,813,191

Patented Nov. 12, 1957

2,813,191

RESISTANCE SOLDERING FIXTURE

John B. Gray III, West Lawn, Pa., assignor to Western Electric Company, Incorporated, New York, N. Y., a corporation of New York Application November 7, 1955, Serial No. 545,234

4 Claims. (Cl. 219—85)

This invention relates to a soldering fixture and particularly to a fixture for accurately locating and resistance soldering a semi-conductor wafer on a small base member.

In the manufacture of semi-conductor translating devices such as point contact transistors and diodes, it is necessary to accurately locate and solder extremely small and fragile semi-conductor wafers on a conductive support or base member. Due to the small size of the parts involved, this operation has been both time consuming and tedious on the part of the operator. In addition, due to the brittle property of the semi-conductor wafer, the wafer often cracks when cooling.

It is, therefore, the object of this invention to provide a fixture to facilitate this soldering operation and to substantially reduce the number of rejects resulting therefrom.

According to the general features of the invention, a pre-tinned base member is accurately positioned and clamped between two conductive members to close a series resistance heating path. Heat generated in the base member melts the pre-tinned surface to solder a wafer positioned thereon in a fixed locating nest and held in pressure contact on the surface by a resilient hold-down member which also acts as a heat sink for preventing overheating of the wafer.

These and other features of the invention will be more fully understood from the following detailed description taken in conjunction with the accompanying drawing, in which.

Figures 1, 2:
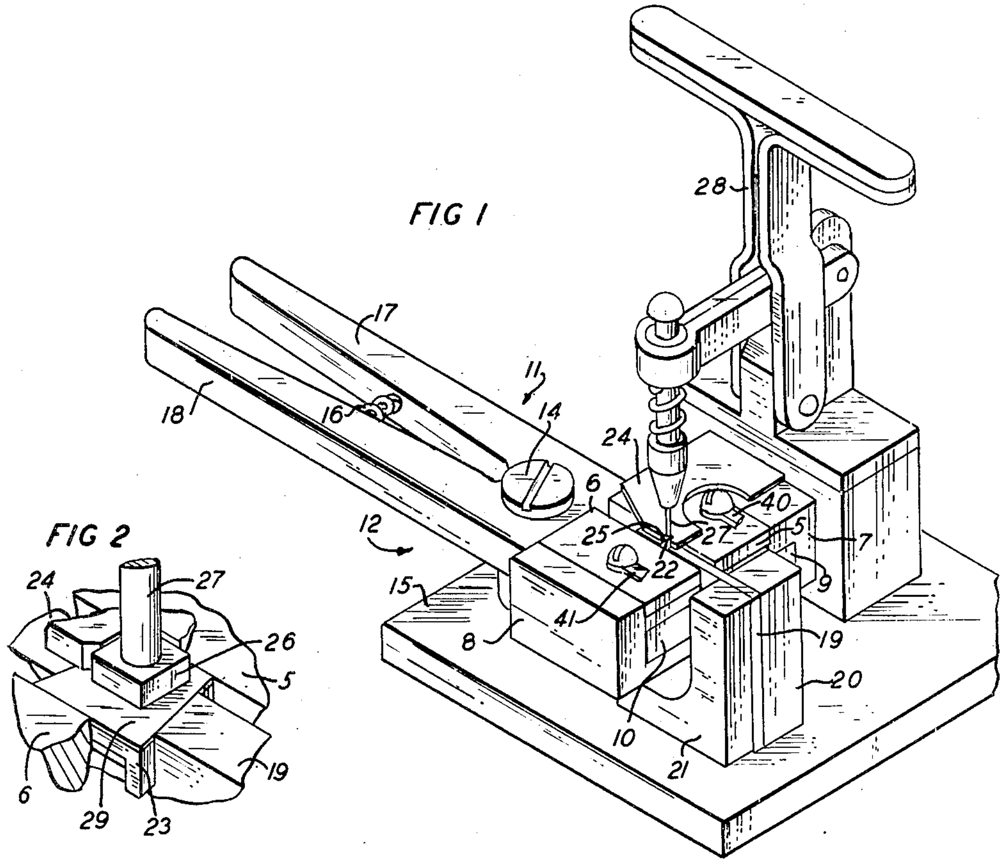
Fig. 1 is a perspective view of a fixture according to the invention.
Fig. 2 is an enlarged view of a portion of the fixture showing a base member and wafer positioned therein.

Referring now to the drawing, a pair of opposed electrically conductive jaws 5 and 6 are insulatedly mounted by members 7 and 8 to the ends 9 and 10 of clamping members 11 and 12 respectively. The members 11 and 12 are pivotally mounted at 14 to a base plate 15 and a spring 16 between hand-operable actuating arms 17 and 18 of the clamping members 11 and 12 respectively normally urge the jaws 5 and 6 together. A fixed insulating member 19, supported on base 15 by members 20 and 21 is interposed between the opposing edges of the movable jaw members 5 and 6, a notch 22 being provided in the upper edge thereof for supporting a wedge shaped base member 23 in fixed position so that it may be clamped between the jaws 5 and 6 and provide electrical contact therewith. An insulating member 24 on the member 7 and movable therewith has a recess or nest 25 for receiving a semi-conductor wafer 26 therein for accurately positioning the wafer upon the base member 23 which is located in the notch 22 therebelow. A metallic (i. e., tantalum) hold-down member 27 which is resiliently supported on a toggle clamp 28 is provided for holding a wafer 26 in pressure contact with surface 29 (which is pre-tinned) of the base member 23 for the soldering operation. This hold-down member also serves as a heat sink for the semi-conductor wafer 26 to prevent its overheating and to prevent cracking of the wafer 26 due to extreme changes in temperature.

Figure 3:
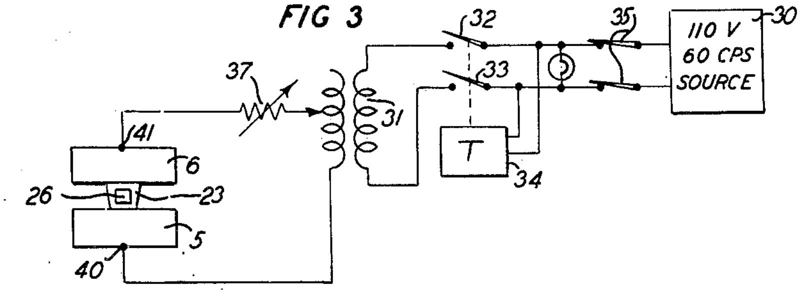
Fig. 3 is a schematic diagram of the resistance soldering circuit for the fixture.

A resistance soldering circuit for the fixture is shown in Fig. 3. In this circuit a 110 volt, 60 cycle source 30 is connected to the primary winding of a transformer 31 through the contacts 32 and 33 of a timer 34 which controls the period during which the transformer 31 will be energized. The timer 34 is energized from the source 30 when the cycle switch 35 is closed to complete the welding circuit, the timer 34 opening its contacts 32 and 33 after the time prescribed for the welding cycle has been completed. The secondary winding of the transformer 31 is connected through a variable resistor 37 to lugs 40 and 41 across the jaws 5 and 6 of the fixture. The current limiting resistor 37 may be adjusted as required for the resistance soldering of the wafer 26 on the pre-tinned surface 29 of the base member 23 which is held in a conductive path between jaws 5 and 6.

In operation, the arms 17 and 18 are clamped together thereby opening or moving the jaw members 5 and 6 thereon apart to permit loading a base member 23 into the fixed notch 22 of the member 19. The arms 17 and 18 are then released to permit the metal contact members 5 and 6 to engage the opposite edges of the base member 23 and to move the nest member 24 in position over the base member 23. The semi-conductor wafer 26 is then positioned in nest 25. The toggle clamp 28 is then moved to the position shown in Fig. 1 and Fig. 2 to hold the wafer 26 in contact with the base member 23 and the cycle switch 35 is then thrown to energize the welding circuit. On the completion of the welding cycle, toggle clamp 28 is opened by moving the handle thereof in a clockwise direction as shown in Fig. 1 to remove the hold-down member 27 from the wafer 26 and the arms 17 and 18 are squeezed together to permit removing the fused base assembly from the notch 22 in the member 19.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. In a fixture for soldering a wafer to a base member, clamping means having opposing conductive members, a fixed support for positioning a base member between the opposing clamping members, and wafer locating means on the clamping means and movable with one of the conductive members for positioning a wafer on a base member clamped between the conductive members.

2. In a fixture for soldering a wafer to a base member, clamping means having opposing electrically conductive members, a fixed support for positioning a base member between the opposing clamping members, wafer locating means on the clamping means and movable with one of the conductive members for positioning a wafer on a base member clamped between the conductive members and a movable heat conducting member of relatively large mass compared to that of a wafer for holding wafers in pressure contact with base mmebers positioned in the support and for absorbing heat from the wafers to prevent damage thereto when the base members are heated to solder the wafers thereto.

3. A fixture for soldering a wafer to a pre-tinned base member comprising, clamping means having opposing conductive members, a fixed support for positioning a base member between the opposing clamping members, wafer locating means on the clamping means and movable with one of the conductive members for positioning a wafer on a base member clamped between the conductive members, and means for passing an electrical current through the conductive members and a base member clamped therebetween to solder a wafer thereto.

4. A fixture for soldering a semi-conductor wafer to a pre-tinned base member comprising, clamping means having opposing electrically conductive members, a fixed support for positioning a base member between the opposing clamping members, wafer locating means on the clamping means and movable with one of the conductive members for positioning a wafer on a base member clamped between the conductive members, a movable heat conducting member of relatively large mass compared to that of a wafer for holding wafers in pressure contact with base members positioned in the support and for absorbing heat from the wafers to prevent damage thereto when the base members are heated, and means for passing an electrical current through the conductive members and a base member clamped therebetween to solder a wafer thereto.

References Cited in the file of this patent

UNITED STATES PATENTS

| | | |
|---|---|---|
| 2,139,499 | Howie | Dec. 6, 1938 |
| 2,141,288 | Bouchard | Dec. 27, 1938 |
| 2,397,052 | Schietinger | Mar. 19, 1946 |
| 2,494,474 | Fermanian et al. | Jan. 10, 1950 |
| 2,602,872 | Ziegler | July 8, 1952 |